United States Patent [19]
Lee

[11] Patent Number: 5,650,830
[45] Date of Patent: Jul. 22, 1997

[54] DEVICE AND METHOD FOR AUTO FINE TUNING

[75] Inventor: Dong Ha Lee, Daegu-si, Rep. of Korea

[73] Assignee: Goldstar Co., Ltd., Seoul, Rep. of Korea

[21] Appl. No.: 337,187

[22] Filed: Nov. 7, 1994

[30] Foreign Application Priority Data

Nov. 5, 1993 [KR] Rep. of Korea ............... 23414/1993

[51] Int. Cl.⁶ ............................ H04N 5/50; H04N 5/44
[52] U.S. Cl. ................... 348/731; 348/735; 455/183.1; 455/182.2; 455/192.2
[58] Field of Search ........................ 455/182.2, 182.3, 455/183.1, 192.2, 192.3, 192.1; 348/731, 732, 733, 735; H04N 5/50, 5/44

[56] References Cited

U.S. PATENT DOCUMENTS 4,868,892  9/1989  Tults et al. .................. 348/732
5,212,554  5/1993  Tults ............................ 348/732
5,428,405  6/1995  Lee .............................. 348/731
5,455,636  10/1995  Furrey et al. ................ 348/731

*Primary Examiner*—Glenton B. Burgess
*Attorney, Agent, or Firm*—Fish & Richardson P.C.

[57] ABSTRACT

A device and method for auto fine tuning for a television or a VCR which carries out auto fine tuning using tuning data of a channel is provided. The AFC (Auto Fine Control) information detected in response to the AFT (Auto Fine Tuning) signal applied at the time of channel selection is used as the tuning data.

Exact and easy determination upon detection of a synchronization signal for the tuning data of the center frequency at the time of initial tuning is facilitated because the determination on the detection of synchronization signal is carried out in the process for processing video signals and reception of clear image through optimum tuning because the fine tuning is carried out utilizing AFT level.

19 Claims, 4 Drawing Sheets

| AFC VOLTAGE | AFC DATA | | | AFC LEVEL |
|---|---|---|---|---|
| | A2 | A1 | A0 | |
| 0 ~ 0.75V | 0 | 0 | 0 | ∅ |
| 0.75V ~ 1.5V | 0 | 0 | 1 | 1 | ← REFERENCE FREQUENCY
| 1.5V ~ 2.25V | 0 | 1 | 0 | 2 |
| 2.25V ~ 3V | 0 | 1 | 1 | 3 |
| 3V ~ | 1 | 0 | 0 | 4 |

DEVICE AND METHOD FOR AUTO FINE TUNING

FIELD OF THE INVENTION

This invention relates to a device and method for auto fine tuning for a VCR or a television which carries out auto fine tuning utilizing tuning data of a channel.

BACKGROUND OF THE INVENTION

As shown in FIG. 1, an auto fine tuning device employed in a conventional television or a VCR includes a remote control signal receiving part 2 for receiving transmission signals from a remote controller, a key pad 3 for applying operation orders according to user input through keys, a microcomputer 1 for controlling tuning to a broadcasting signal by transmitting tuning data in response to the signals received from the remote control signal receiving part 2 and the key pad 3 and transmitting designated control signals for generation of OSD letters, a tuner 4 for transmitting a broadcasting signal of a selected channel of the signals received through an antenna ANT under the control of the microcomputer 1, an intermediate frequency signal processing part 5 for processing the output signal of the tuner 4 into an intermediate frequency signal and transmitting a synchronization signal of the broadcasting signal and an auto fine tuning signal(hereinafter called 'AFT') to the microcomputer 1, a video signal processing part 6 for processing an video signal received from the intermediate frequency signal processing part 5, an audio signal processing part 9 for processing an audio signal received from the intermediate frequency signal processing part 5, an OSD character generation part 7 for transmitting OSD characters in response to the control signal received from the microcomputer 1, and a synthesizing part 8 for synthesizing the video signals received from the video signal processing part 6 and the OSD characters received from the OSD character generation part 7 and transmitting the synthesized signals to a color picture tube CPT.

Operation of the convention auto fine tuning device described above is explained below.

When a user, by pressing the buttons on the remote controller, transmits a channel selection to the remote control signal receiving part 2, or by pressing the keys on the key pad 3, transmits a channel selection to the microcomputer 1, the microcomputer 1, transmits channel tuning data to the tuner 4. The tuner 4 detects the signal of the selected channel from the broadcasting signals received through the antenna and transmits the detected signal to the intermediate frequency signal processing part 5.

The broadcasting signal received from the tuner 4 is processed into an intermediate frequency signal, detected as a synchronization signal and AFT signal at the intermediate frequency signal processing part 5.

Upon reception of the detected synchronization signal and the AFT signal, the microcomputer 1 determines the broadcasting signal of the selected channel tuned to the received synchronization signal, and according to the result of the determination, transmits tuning data to the tuner 4 to carry out fine tuning.

The broadcasting signal selected through the foregoing process is processed into an intermediate frequency signal at the intermediate frequency signal processing part 5, and the video signal and the audio signal received from the intermediate frequency signal processing part 5 are transmitted to the video signal processing part 6 and the audio signal processing part 9, respectively.

The audio signal, processed at the audio signal processing part 9 is, transmitted to a speaker, and the video signal is processed into an image at the video signal processing part 6 synthesized at the synthesizing part 8 with the OSD character signal received from the OSD character generation part 7 under control of the microcomputer 1, and displayed on a color picture tube CPT.

The conventional fine tuning device has problems in that the convention fine tuning device has difficulty in exactly distinguishing the tuning data of a center frequency from the synchronization signal received according to the phase locked loop data at the time of initial channel tuning. In particular, the conventional fine tuning device cannot exactly tune in the broadcasting signal when the AFT signal level has been mistuned even though the broadcasting signal has been detected at search time, due to processing of the synchronization signal determination at the intermediate frequency signal processing part 5 at the time of initial tuning, i.e., at search time of search.

SUMMARY OF THE INVENTION

Accordingly, this invention solves the foregoing problems by providing a device and method for auto fine tuning, which can carry out tuning based on tuning data from AFC (Auto Fine Control) information detected in response to the AFT (Auto Fine Tuning) signal applied to the time of channel selection.

These and other objects and features of this invention can be achieved by providing a device for auto fine tuning comprising a timer for receiving broadcasting signals through an antenna according to band data, an intermediate frequency signal processing part for separating an intermediate signal into a video signal and an audio signal when the signal received from the tuner is processed into the intermediate frequency signal, and generating auto fine control voltage when an auto fine tuning signal is detected, a frequency synthesizer for scaling the auto fine control voltage received from the intermediate frequency signal processing part into auto fine control data, and generating band data according to tuning data and applying the generated band data to the tuner, a video signal processing part for detecting a synchronization signal from the video signal received from the intermediate frequency signal processing part, and a microcomputer for applying the tuning data of the selected channel to the frequency synthesizer and controlling the tuner according to the auto fine control data received from the frequency synthesizer and the synchronization signal received from the video signal processing part, and by providing a method for auto fine tuning comprising steps for determining a first synchronization signal detection for carrying out tuning according to a first center frequency a center frequency of a selected channel at application of channel data and determining detection of a synchronization signal, determining a second synchronization signal detection for carrying out tuning according to a second center frequency a frequency lowered down by a certain value from the first center frequency if the synchronization signal found not detected as the result of carrying out the step for determining a first synchronization signal detection, tuning original center frequency for carrying out tuning according to the first center frequency if the synchronization signal found not detected as the result of carrying out the step for determining a second synchronization signal detection, and carrying out tuning for carrying out tuning by applying fine tuning data based on the first and the second center frequency according to auto fine control level if the synchronization signal has been detected as the result of carrying out the steps for determining the first and the second synchronization signal detection.

BRIEF DESCRIPTION OF THE INVENTION

DETAILED DESCRIPTION OF THE INVENTION

Figure 1:
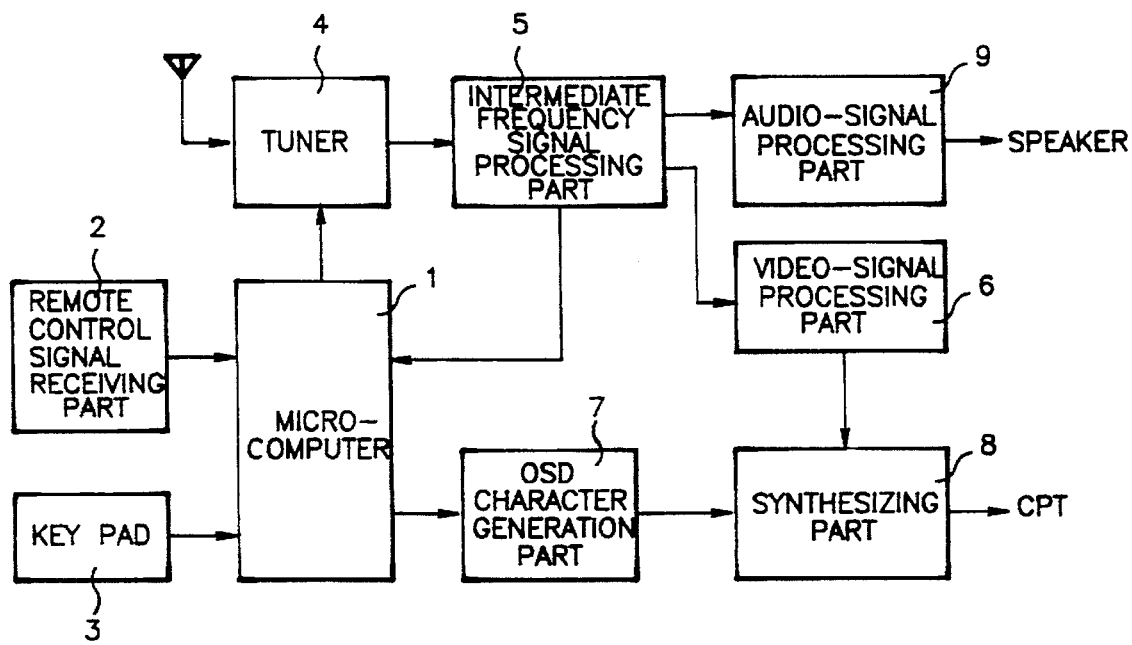
FIG. 1 is a system for a conventional auto fine tuning device.
Figure 2:
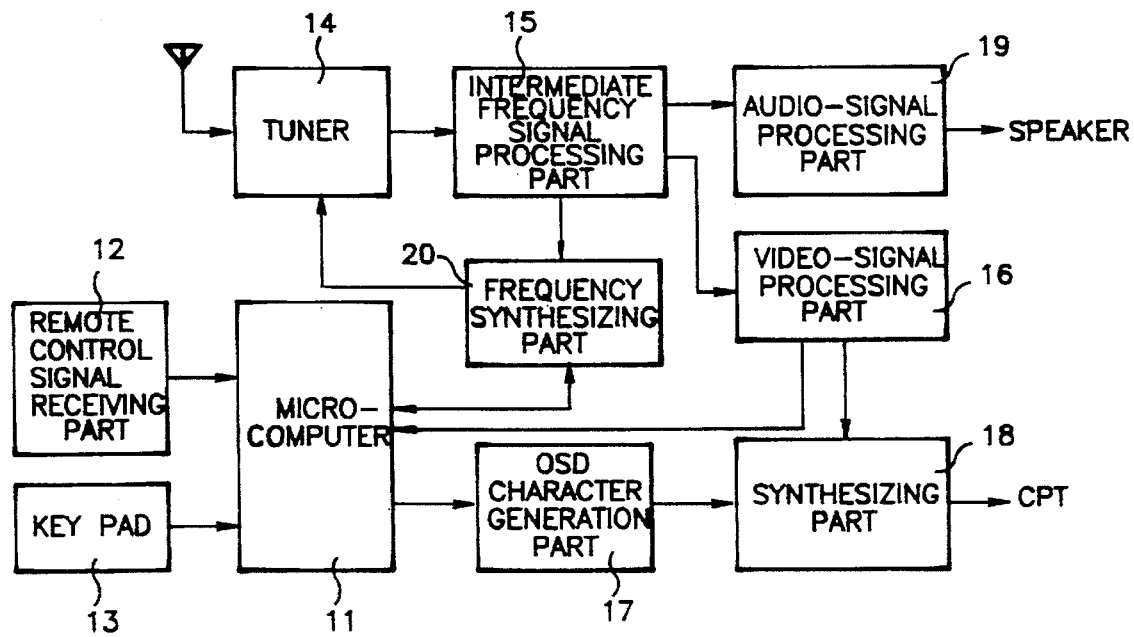
FIG. 2 is a system of an auto fine tuning device in accordance with this invention.

This invention will now be described with reference to FIGS. 2 through 6. As shown in FIG. 2, an auto fine tuning device in accordance with this invention comprises a microcomputer 11, a tuner 14, an intermediate frequency signal processing part 15, an audio signal processing part 19, a video signal processing part 16, an OSD character generation part 17, a synthesizing part 18, and a frequency synthesizing part 20.

The tuner 14 receives broadcasting signals through an antenna according to band data received from the frequency synthesizing part 20.

The intermediate frequency signal processing part 15 processes the signal received from the tuner 14 into an intermediate frequency, separates the signal into a video signal and an audio signal detects the AFT (Auto Fine Tuning) signal and, generates an AFC (Auto Fine Control) voltage.

The audio signal processing part 19 processes the audio signal received from the intermediate frequency signal processing part 15 and transmits the processed audio signal to a speaker.

The video signal processing part 16 detects a synchronization signal from the video signal received from the intermediate frequency signal processing part 15, transmits the detected synchronization signal to the microcomputer 11, and processes the video signal and transmits the processed video signal to the synthesizing part 18.

The frequency synthesizing part 20 scales the AFC voltage received from the intermediate frequency signal processing part 15 into AFC data, transmits the AFC data to the microcomputer 11, generates band data according to the tuning data received from the microcomputer 11 and transmits the generated band data to the tuner 14.

The frequency synthesizing part 20 scales the AFC voltage into AFC data after dividing the AFC voltage into five levels, i.e., from '0' level to '4' level, and transmits the AFC data to the microcomputer 11.

The microcomputer 11 applies the tuning data of the channel selected by a user to the frequency synthesizing part 20, controls tuning of the broadcasting signal according to the AFC data received from the frequency synthesizing part 20 and the synchronization signal received from the video signal processing part 16, and applies a predetermined control signal for generating OSD character generation part 17.

The synthesizing part 18 synthesizes the signal received from the video signal processing part 16 and the signal received form the OSD character generation part 17 and presents the synthesized signal to a color picture tube.

Operation of the auto fine tuning device having the system described above will now be explained.

First, when a user selects a channel using a remote controller or a key pad 13, the signal corresponding to the selected channel is applied to the microcomputer 11 through the remote control signal receiving part 12 or the key pad 13, respectively. When the signal corresponding to the selected channel is received, the microcomputer 11, generates tuning data corresponding to the selected channel transmits the tuning date to the frequency synthesizing part 20. The tuning data received from the microcomputer 11 is processed into a band data at the frequency synthesizing part 20 which is used for the tuner 14 for carrying out tuning.

The broadcasting signal received after being tuned at the tuner 14 according to the band data is processed into an intermediate frequency signal, separated into a video signal and an audio signal, processed into image and sound at the video signal processing part 16 and the audio signal processing part 19, respectively, and transmitted to the synthesizing part 18 and a speaker, respectively. The video signal received from the video signal processing part 16 is, synthesized at the synthesizing part 18 with the character signal received from the OSD character generation part 17 and transmitted to a color picture tube CPT.

The intermediate frequency signal processing part 15 detects an AFT signal for auto fine tuning from the signal received from the tuner 14, generates an AFC voltage, and transmits the generated AFC voltage to the frequency synthesizing part 20. The AFC voltage transmitted form the intermediate signal processing part 15 to the frequency synthesizing part 20 is scaled into AFC data therein, and transmitted to the microcomputer 11. The video signal received from the intermediate frequency signal processing part 15 is detected as a synchronization signal at the video signal processing part 16 and transmitted to the microcomputer 11.

The microcomputer 11 makes presentation of the best clear image available by tuning the broadcasting signal for a selected channel using the synchronization signal received from the video signal processing part 16 and the AFC data received from the frequency synthesizing part 20, and controlling the frequency synthesizing part 20 to carry out auto fine tuning based on the tuning data received according to the result of the tuning the microcomputer 11.

Figures 3, 4:
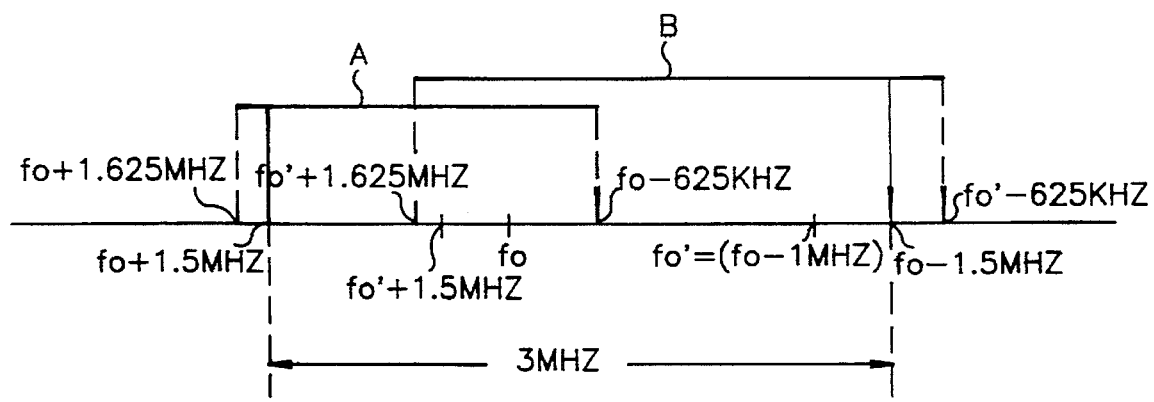
FIG. 3 shows the correlation between AFC voltage and AFC level.
FIG. 4 shows the search range of the auto fine tuning.

Referring to FIG. 3, the AFC voltage received from the intermediate frequency signal processing part 15, and the AFC data and the AFC level received from the frequency synthesizing part 20 will now be explained.

The AFC voltage detected at and received from the intermediate frequency signal processing part 15 has widely varying values ranging from '0' V to over '3' V. The AFC voltage received from the intermediate frequency signal processing part 15 is applied to the microcomputer 11 after being divided into five levels of '0.75' V intervals at the frequency synthesizing part 20 applies. The frequency synthesizing part 20 divides the AFC voltage as follows: (1) to the microcomputer 11 after designating from '0' V to '0.75' V as '0' level and the AFC data is '000' for the recognition by the microcomputer 11 from '0.75' V to '1.5' V is designated as '1' level and the AFC data s '001' for the recognition of the microcomputer 11; (2) from '1.5' V to '2.25' V is designated to '2.25' V as '2' level and the AFC data is '010' for the recognition by the microcomputer 11; (4) from '2.25' V to '3' V is designated to '3' V as '3' level and the AFC data is '011' ** for the recognition by the microcomputer 11; (5) and over '3' V to the microcomputer 11 after designating the over '3' V as '4' level and the AFC data as '100' for the recognition of the microcomputer 11.

Herein, the '2' level is the reference frequency being a reference at the time of the fine tuning, and the microcomputer 11, in order to match with the '2' level, transmits tuning data in a direction to lower down the tuning frequency if it is higher than the '2' level and transmits the tuning data in a direction to raise up the tuning frequency if it is lower than the '2' level at the time of fine tuning.

Operation detail of such a tuning at the time of auto fine tuning is to be explained hereinafter, referring to FIG. 4.

As shown in FIG. 4, the microcomputer 11 carries out searches up to 1.5 MHZ band in up and down direction for total 3 MHz band with reference to a first center frequency f0 that is a center frequency of a selected channel within the frequency band of broadcasting signal; but, for the sake of ease of embodiment, actually carries out searches up to 1.625 band in up and down direction with reference to the first center frequency f0. In this instant, to carry out an efficient auto fine tuning, the band is divided into a first search range a and second search range B.

The first search range A is a frequency band ranging from a point raised up by 1.625 MHz and to a point lowered down by 0.625 MHz with reference to the first center frequency f0, and the second search range B is a frequency band ranging from a point raised up by 1.625 MHz to a point lowered down by 0.625 MHz in reference to a second center frequency f0' that is a frequency lowered down by 1 MHz from the first center frequency f0.

The microcomputer 11 carries out auto fine tuning over the first and the second search ranges according to AFC data and synchronization signal.

Figure 5:
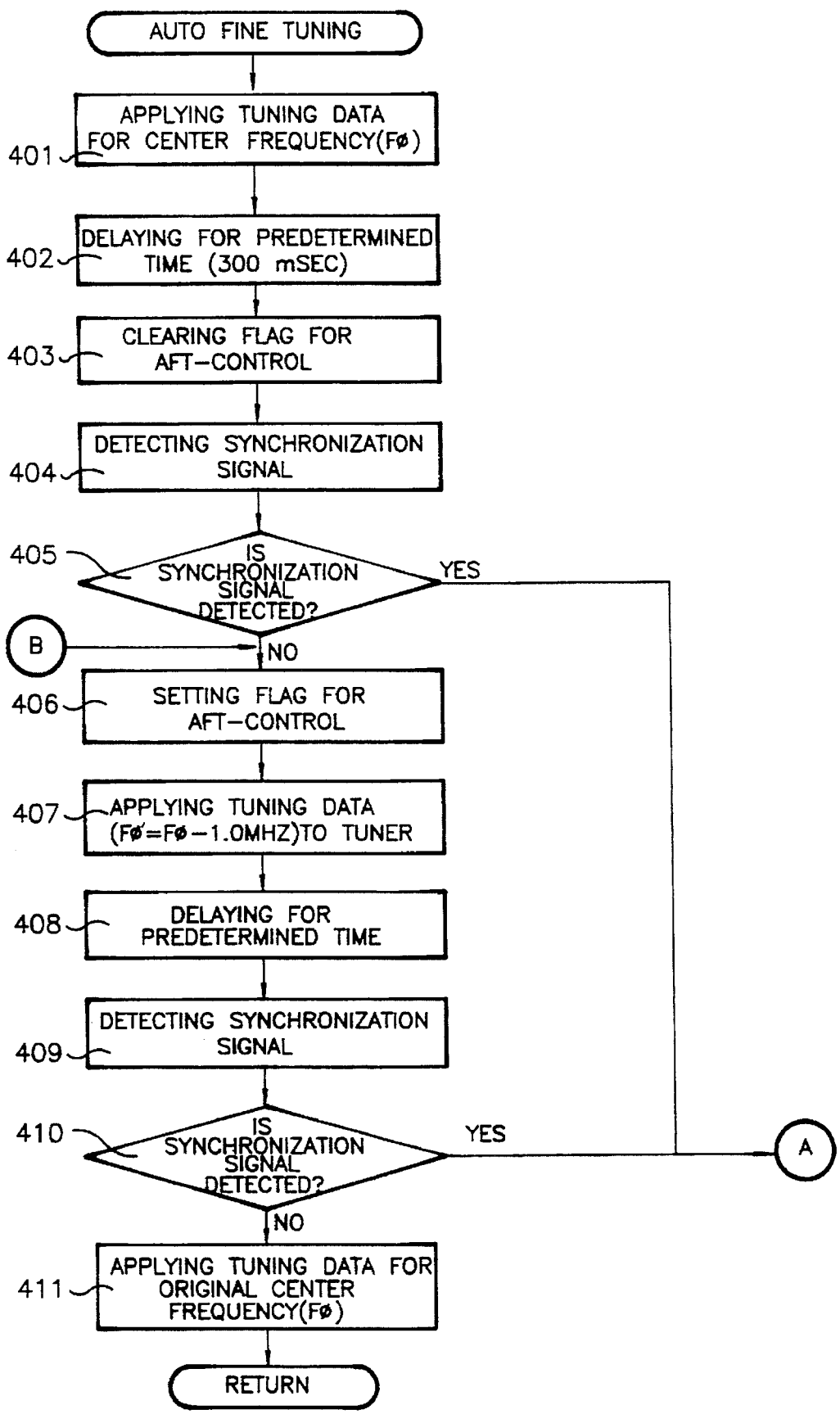
FIGS. 5 and 6 are flow charts of a method for auto fine tuning in accordance with this invention.
Figure 6:
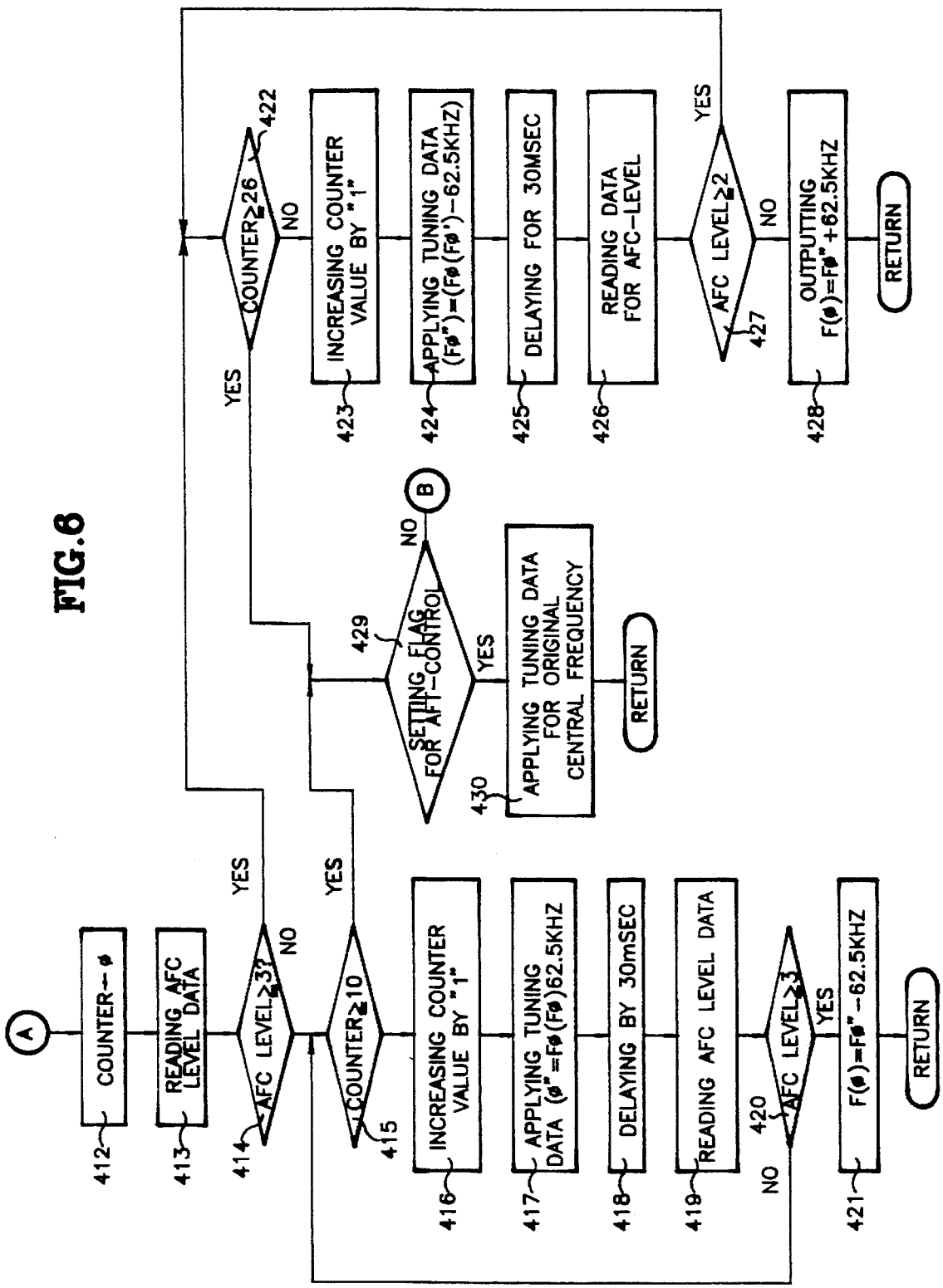

A method for carrying out auto fine tuning in accordance with this invention is to be explained, referring to FIGS. 5 and 6.

When the channel data is received, an auto fine tuning is initiated with muted image and sound, which is to be explained hereinafter in detail.

A first synchronization signal detection determination step 401–405 is carried out on receiving channel data for carrying out tuning based on the first center frequency f0 that is the center frequency of a selected channel and determining detection of synchronization signal. That is, tuning is carried out on receiving channel data, by applying tuning data based on the first center frequency f0 401, and a delay is made 402 for a certain time period, i.e., for 300 ms after the application of tuning data based on the first center frequency f0 for a broadcasting signal received through the tuner to have a time period of being able to come out into a video signal, during which the broadcasting signal can be processed into an intermediate frequency signal, and being separated of a video signal and detected of a synchronization signal. And, by clearing AFT control flag which makes the auto fine tuning available 403, the fact that auto fine tuning for the first center frequency is underway is informed. Synchronization signal is detected from the video signal tuned after having delayed for a certain period of time 404 and the detection of synchronization signal is determined 405.

If the synchronization signal has not been detected as the result of carrying out the foregoing first synchronization signal matching determination step, the second synchronization signal detection determination step 406–410 is carried out for carrying out tuning based on the second center frequency f0' that is a frequency lowered by a certain amount, i.e., by 1.0 MHz from the first center frequency f0 and determining the detection of the synchronization signal. That is, if synchronization signal has not been detected as the result of carrying out the first synchronization signal determination step, by setting AFT control flag which makes an auto fine tuning available 406, the fact that an auto fine tuning for the first center frequency f0 under way is informed. After setting the AFT control flag, the second center frequency f0' is calculated by lowering the first center frequency f0 by a certain amount, i.e., by 1.0 MHZ 407, and tuning is carried out by applying tuning data based on the second center frequency f0' 407. A delay is made 408 for a certain time period, i.e., for 300 ms after the application of tuning data based on the second center frequency f0' for the broadcasting signal received through the tuner to have a time period of being able to come out into a video signal, during which the broadcasting signal can be processed into an intermediate frequency, being separated of video signal and detected of synchronization signal. A synchronization signal is detected from the video signal tuned and applied after having been delayed for a certain period of time 409 and the detection of synchronization signal is determined thereafter 410.

If synchronization signal has not bee detected as the result of carrying out the second synchronization signal determination step, that is, if synchronization signal has not been detected in all the first and the second synchronization signal determination steps, proceeding to an original center frequency tuning step 411 for carry out tuning based on the first center frequency f0, the tuning mode is saved at the original center frequency.

And, if synchronization signal has been detected as the result of carrying out the first and the second synchronization signal determination steps, a tuning step 412–428 is carried out for carrying out tuning by applying the fine tuning data based on the first and the second center frequencies according to AFC level.

In this instant, the AFC level has, as has been explained, the AFC voltage divided into 5 levels, from '0' level for the lowest AFC voltage up to '4' level.

In the tuning step, the tuning step is carried out by applying fine tuning data over a frequency band ranging from a point raised up by 1.625 MHZ to a point lowered down by 0.625 MHz with reference to the first and the second center frequencies f0 and f0' respectively according to AFC level. That is, as shown in FIG. 4, the tuning is carried out by applying fine tuning data for the frequency band ranging from a point raised up by 0.625 MHz to a point lowered down by 0.625 MHz with reference to the first center frequency f0, i.e., for the first search range A, and by applying fine tuning data for the frequency band ranging from a point raised up by 1.625 MHz to a point lowered by 0.625 MHz with reference to the second center frequency f0', i.e., for the second search range B.

The tuning step is to be explained hereinafter in detail, referring to FIG. 6.

First, if a synchronization signal has been detected as the result of carrying out the first and the second synchronization signal detection determination steps, an AFC level determination step 412–414 is carried out for setting a counter value to '0' and determining AFC level.

After carrying out the AFC level determination step, in case the read in AFC level is below '3' level, a first fine tuning step 415–421 is carried out for carrying out fine tuning operation while raising up fine tuning frequency 62.5 KHz by 62.5 KHz successively from a point lowered down by 0.625 MHz with reference to the first and the second center frequencies f0 and f0' according to AFC level.

That is, in case the AFC level is below '3' level, determining the counter value of being '10', if it is found that the counter value is over '10', it is proceeded to a repeated tuning step which will be explained later 415, and if it is below '10', the counter value is increased by '1' 416.

After increasing the counter value by '1', tuning is carried out by applying tuning data after raising up fine tuning frequency by 62.5 KHz from a point lowered down by 0.625 MHZ with reference to the first and the second center frequencies f0 and f0' 417, and after application of the tuning data, AFC level is made transmissible after delaying for a certain period of time, i.e., for 30 ms by detecting the AFC voltage after delaying for a certain period of time, i.e., for 30 ms 418.

After delaying for a certain period of time, AFC level is read and is determined of being over '3', and if the AFC level is found to be below '3', it is proceeded 419 and 420 to a step 415 for determining the counter value, and if the AFC level is found to be over '3' as the result of determination of AFC level, turning mode is saved with fine tuning frequency lowered down by 62.5 KHz from the tuning data having the frequency raised up.

After carrying out the AFC level determination step, a second fine tuning step 422–428 is carried out for carrying out tuning operation while lowering down the fine tuning frequency 62.5 KHz by 62.5 KHz successively from a point raised up by 1.625 MHZ with reference to the first and the second center frequencies f0 and f0' according to AFC level in case the read AFC level is found to be over '3' level.

That is, in case the AFC level is over '3' level, determining the counter value of being '26', if the counter value is found to be over '26', it is proceeded to a repeated tuning step which will be explained later 422, and if found to be below '26', the counter value is increased by '1' 423.

After increasing the counter value by '1', tuning is carried out by applying tuning data with fine tuning frequency lowered down by 62.5 KHz from a point raised up by 1.625 MHz with reference to the first and the second center frequencies f0 and f0' 424. After application of the tuning data, AFC level is made transmissible after delaying for a certain period of time, i.e., for 30 ms 425 by detecting the AFC voltage after delaying for a certain period of time, i.e., for 30 ms 425.

After delaying for a certain period of time, AFC level is read and is determined to be over '2', and if AFC level is found to be over '2', it is proceeded 426 and 427 to a step 422 for determining the counter value, and if the AFC level is found to be below '2' as the result of determining AFC level, tuning mode is saved 428 with tuning frequency raised up by 62.5 KHz from the tuning data having the frequency lowered down.

In case the first and the second fine tuning steps are made available by the detected synchronization signal in the first synchronization signal detection determination step, a repeated tuning step 429 and 430 is carried out for carrying out the second synchronization signal detection determination step when fine tuning happens in a frequency band ranging from a point raised up by 1.625 MHZ with reference to the second center frequency f0' to a point lowered down by 0.625 MHz with reference to the first center frequency f0.

That is,, upon searching for setting of AFT control flag which makes auto fine tuning available 429, it is proceeded to the original center frequency tuning step 411 for proceeding to the second synchronization signal detection determination step if the AFT control flag found not set, and applying the original center frequency as tuning data if the AFT control flag found set as the result of search, and the tuning mode is saved.

The tuning method in accordance with this invention carried out as the foregoing description is to be explained hereinafter in detail, referring to FIGS. 3, 4, 5, and 6.

AFT flag that makes, on reception of channel data, tuning available by applying tuning data based on the first center frequency f0 401, delay for 300 ms after application of tuning data based on the first center frequency f0 402, and carry out auto fine tuning, is cleared 403. A synchronization signal is detected from the video signal tuned and applied after 300 ms delay 404, and the detection of a synchronization signal is determined 405.

If the synchronization signal has been detected as the result of the determination, since it means that fine tuning frequency is coming out based on the first center frequency f0, fine tuning operation is carried out based on the first center frequency, f0, which is to be explained hereinafter in detail.

First, AFC level is determined with the counter value set on '0', 412, 413, and 414, wherein, in case the AFC level is below '3', since it means that the fine tuning frequency can be found in a frequency band ranging from a point the first center frequency f0 falls on to a point lowered down by 0.624 MHZ from the first center frequency f0, fine tuning is carried out by raising up fine tuning frequency 62.5 KHz by 62.5 KHz, increasing the counter value '1' by '1', from a point lowered by 0.625 MHZ from the first center frequency f0 until the counter value becomes '10'.

That is, on determining the counter value of being '10' again, if the counter value is below '10', the counter value is increased by '1' 416, and tuning is carried out by applying tuning data which will raise up fine tuning frequency by 62.5 KHz from a point lowered down by 0.625 MHZ from the first center frequency f0 417. After delaying 30 ms since the application of tuning data 418, AFC level is read, and is determined of being over '3' 419 and 420.

Herein, the reason to determine AFC level being over '3' is that the case of AFC level being over '3' means that fine tuning has been completed and is a case fine tuning frequency should be lowered down again because, at the present time, fine tuning operation is carried out while raising up the fine tuning frequency 62.5 KHz by 62.5 KHz from a point lowered by 0.625 MHZ from the first center frequency f0.

As the result of determination of the read in AFC level, if the AFC level is below '3' level, i.e., if the AFC level is '0', '1', '2', proceeding to the counter value determination step 415, a point which has an AFC level over '3' is searched with the fine tuning frequency raised up 62.5 KHz by 62.5 KHz continuously while increasing the counter value.

As the result of determination of the AFC level, if the AFC level is over '3', i.e., if the AFC level is '3', or '4', fine tuning is finished with saved tuning mode with the fine tuning frequency lowered by 62.5 KHz from the tuning data having the frequency raised up 421.

And as the result of determining the counter value of being over '10' 415, if it is found to be over '10', it is proceeded 415 to a repeated tuning step 429 and 430. Herein, what the counter value is over '10' means that fine tuning has been carried out up to the first center frequency f0 by raising up the fine tuning frequency 62.5 KHz by 62.5 KHz for 10 times, and it means that the fine tuning frequency can not be found within the frequency band from a point the first center frequency f0 falls on to a point lowered by 0.625 MHZ from the first center frequency f0. Therefore, it is proceeded to the repeated tuning step.

That is, on searching the setting of the AFT control flag which makes auto fine tuning available 429, if the AFT control flag found not set, since it means that the Aft control flag has been cleared having proceeded from the first synchronization signal detection determining step, proceeding to the second synchronization signal detection determination step, it is made available to carry out searches for a common range of the first and the second search ranges for two times. As the result of searches, if the AFT control flag found set, since it means that it has been proceeded from the second synchronization signal detection determination step, the search is finished, and proceeding to the original center frequency tuning step for applying original center frequency as a tuning data, fine tuning is finished.

And, as the result of the AFC level determination 414, in case the AFC level is over '3' level, since it means that the fine tuning frequency can be found in a frequency band ranging from a point the first center frequency f0 falls on to a point raised up by 1.625 MHZ from the point the first center frequency f0 falls on, fine tuning is carried out by lowering fine tuning frequency 62.5 KHz by 62.5 KHz, increasing the counter value '1' by '1', from the point raised by 1.625 MHZ from the point the first center frequency f0 falls on until the counter value becomes '26'.

That is, on determining the counter value of being '26', if the counter value is below '26', the counter value is increased by '1' 423, and tuning is carried out by applying tuning data with the fine tuning frequency lowered by 62.5 KHz from a point raised up by 1.625 MHZ from the point the first center frequency f0 falls on 424. After delaying for 30 ms since the application of tuning data 425, AFC level is read, and determining of being over '2' level, if the level found over '2' level, the counter value is determined 426 and 427.

Herein, the reason to determine AFC level being over '2' is that the case of AFC level being below '2' means that fine tuning has been finished and is a case fine tuning frequency should be raised up again because, at the present time, fine tuning operation is carried out while lowering the fine tuning frequency 62.5 KHz by 62.5 KHz from a point raised up by 1.625 MHZ from the point the first center frequency f0 falls on.

As the result of determination of the read in AFC level, if the AFC level is over '2' level, i.e., if the AFC level is '2', '3', or '4', proceeding to the counter value determination step 422, a point that has an AFC level below '2' is searched with the fine tuning frequency lowered down 62.5 KHz by 62.5 KHz continuously while increasing the counter value.

And as the result of determination of the AFC level, if the AFC level is below '2', i.e., if the AFC level is '0', or '1', the fine tuning is finished after tuning mode is saved with the fine tuning frequency raised up by 62.5 KHz from the tuning data having the frequency raised up 428.

And as the result of determining the counter value of being over '26', if it is found to be over '26', it is proceeded 422 to a repeated tuning step 429 and 430. Herein, what the counter value is over '26' means that fine tuning has been carried out up to the first center frequency f0 by raising up the fine tuning frequency 62.5 KHz by 62.5 KHz for 26 times, and it means that the fine tuning frequency can not be found within the frequency band ranging from a point the first center frequency f0 falls on to a point raised up by 1.625 MHZ from the first center frequency f0. Therefore, it is proceeded to the repeated tuning step, which is proceeded as has been described before.

As the result of carrying out the first synchronization signal detection determination step, if the synchronization signal is not detected, the AFT control flag which makes the auto fine tuning available is set 406, the second center frequency f0' is calculated 407 by lowering down the first center frequency f0 by 1 MHZ 407. Tuning is carried out by applying tuning data based on the second center frequency f0' 407, a delay is made for 300 ms after application of the tuning data based on the second center frequency f0' 408. A synchronization signal is detected from the video signal tuned and applied after delay 409 and detection of synchronization signal is determined 410.

As the result of determination, if the synchronization signal has been detected, since it means that the fine tuning frequency coming out based on the second center frequency f0', fine tuning operation is carried out centered on the second center frequency f0', which is to be explained hereinafter in detail.

First, AFC level is determined with the counter value set on '0' 412, 413, and 414, wherein, in case the AFC level is below '3', since it means that the fine tuning frequency can be found within a frequency band ranging from a point the second center frequency f0' falls on to a point lowered down by 0.624 MHz from a point the second center frequency f0' falls on, fine tuning is carried out by raising fine tuning frequency 62.5 KHz by 62.5 KHz, increasing the counter value '1' by '1', from the point lowered by 0.625 MHZ from the second center frequency f0' until the counter value becomes '10'.

That is, on determining the counter value of being '10' again, if the counter value is below '10', the counter value is increased by '1' 416, and tuning is carried out by applying tuning data which will increase fine tuning frequency by 62.5 KHz from a point lowered by 0.625 MHZ from the point the second center frequency f0' falls on 417. After delaying for 30 ms since the application of tuning data 418, AFC level is read, and is determined of being over '3' 419 and 420.

Herein, the reason to determine AFC level of being over '3' is that the case of AFC level being over '3' means that fine tuning has been completed and is a case fine tuning frequency should be lowered down again because, at the present time, fine tuning operation is carried out while raising the fine tuning frequency 62.5 KHz by 62.5 KHz from a point lowered by 0.625 MHZ from the second center frequency f0'.

As the result of determination of the read in AFC level, if the AFC level is below '3' level, i.e., if the AFC level is '0', '1', or '2', proceeding to the counter value determination step 415, a point which has an AFC level over '3' is searched with the fine tuning frequency raised up 62.5 KHz by 62.5 KHz continuously while increasing the counter value.

As the result of determination of the AFC level, if the AFC level is over '3', i.e., if the AFC level is '3' or '4', the fine tuning is finished after tuning mode is saved with the fine tuning frequency lowered by 62.5 KHz from the tuning data having the frequency raised up 421.

And as the result of determining the counter value of being over '10' 415, if it is over '10', it is proceeded 415 to a repeated tuning step 429 and 430. Herein, what the counter value is over '10' means that fine tuning has been carried out up to the second center frequency f0' by raising up the fine tuning frequency 62.5 KHz by 62.5 KHz for 10 times, and it means that the fine tuning frequency can not be found within a frequency band ranging from a point the first center frequency f0 falls on to a point lowered by 0.625 MHZ from the second center frequency f0'. Therefore, it is proceeded to the repeated tuning step.

And, as the result of the AFC level determination 414, in case the AFC level is over '3' level, since it means that the fine tuning frequency can be found within a frequency band ranging from a point the second center frequency f0' falls on to a point raised up by 1.625 MHZ from the point the second center frequency f0' falls on, fine tuning is carried out by lowering fine tuning frequency 62.5 KHz by 62.5 KHz, increasing the counter value '1' by '1', from the point raised by 1.625 MHZ from the point the second frequency f0' falls on until the counter value becomes '26'.

That is, at determining the counter value of being '26', if the counter value is below '26', the counter value is increased by '1' 423, and tuning is carried out by applying tuning data with the fine tuning frequency lowered by 62.5 KHz from a point raised up by 1.625 MHz from the point the second center frequency f0' falls on 424. After delaying for 30 ms since the application of tuning data 425, AFC level is read, and determining of being over '2' level, if the level found over '2' level, the counter value is determined 426 and 427.

Herein, the reason to determine AFC level of being over '2' is that the case of AFC level being below '2' means that fine tuning has been finished and is a case fine tuning frequency should be raised up again because, at the present time, fine tuning operation is carried out while lowering the fine tuning frequency 62.5 KHz by 62.5 KHz from a point raised up by 1.625 MHZ from the point the second center frequency f0' falls on.

As the result of determination of the read in AFC level, if the AFC level is over '2' level, i.e., if the AFC level is '2', '3', or '4', proceeding to the counter value determination step 422, a point which has an AFC level '2' is searched with the fine tuning frequency lowered down 62.5 KHz by 62.5 KHz continuously while increasing the counter value.

And as the result of determination of the AFC level, if the AFC level is below '2', i.e., if the AFC level is '0', or '1', the fine tuning is finished after tuning mode is saved with the fine tuning frequency raised up by 62.5 KHz from the tuning data having the frequency raised up 428.

And as the result of determining the counter value of being over '26', if it is over '26', it is proceeded 422 to a repeated tuning step 429 and 430. Herein, what the counter value is over '26' means that fine tuning has been carried out up to the second center frequency f0' by raising up the fine tuning frequency 62.5 KHz by 62.5 KHz for 26 times, and it means that the fine tuning frequency can not be found within the frequency band ranging from a point the second center frequency f0' falls on to a point raised up by 1.625 MHZ from the second center frequency f0'. Therefore, it is proceeded to the repeated tuning step, which is proceeded as has been described before.

As has been explained, this invention facilitates exact and easy determination on the detection of synchronization signal for the tuning data of the center frequency at the time of initial tuning because the determination on the detection of synchronization signal is carried out in the process for processing video signals and reception of clear image through optimum tuning because the fine tuning is carried out utilizing AFT level.

Although the invention has been described in conjunction with specific embodiments, it is evident that many alternatives and variations will be apparent to those skilled in the art in light of the foregoing description. Accordingly, the invention is intended to embrace all of the alternatives and variations that fall within the spirit and scope of the appended claims.

What is claimed is:

1. A device for auto fine tuning comprising:

a tuner for receiving broadcasting signals through an antenna according to band data;

an intermediate frequency signal processing part for processing a signal from said tuner into an intermediate frequency signal, separating the intermediate frequency signal into a video signal and an audio signal, and generating an auto fine control (AFC) voltage after detecting an auto fine tuning signal;

a frequency synthesizer for scaling the auto fine control voltage received from the intermediate frequency signal processing part into auto fine control (AFC) data, generating band data according to tuning data, and applying the generated band data to the tuner;

a video signal processing part for detecting a synchronization signal from the video signal received from the intermediate frequency signal processing part; and a microcomputer for applying the tuning data of a selected channel to the frequency synthesizer to control the tuner according to the auto fine control data received from the frequency synthesizer and the synchronization signal received from the video signal processing part.

2. The device for auto fine tuning as claimed in claim 1, wherein the frequency synthesizing part scales the AFC voltage into AFC data after dividing the AFC voltage into five levels.

3. A method for auto fine tuning comprising the steps of:

determining detection of a first synchronization signal for tuning on channel data based on a first center frequency, the first center frequency being a center frequency of a selected channel, and detecting a synchronization signal;

determining detection of a second synchronization signal for carrying out tuning based on a second center frequency, the second center frequency being a frequency decreased by a certain value from the first center frequency if the synchronization signal is not detected during the step for determining a first synchronization signal detection;

tuning a center frequency based on the first center frequency if the synchronization signal is not detected during the step for determining a second synchronization signal detection; and carrying out tuning by applying fine tuning data based on the first and the second center frequency according to an auto fine control level if the synchronization signal has been detected during the steps for determining the first and the second synchronization signal detection.

4. The method as claimed in claim 3, wherein the step for determining detection of the first synchronization signal comprises the steps of:

carrying out tuning on receiving channel data by applying tuning data based on the first center frequency, delaying a certain time period after the application of tuning data based on the first center frequency, clearing an AFT control flag to make the auto fine tuning available, detecting a synchronization signal from a video signal tuned and applied after having been delayed, and determining detection of a synchronization signal.

5. The method as claimed in claim 4, wherein the delay in the step for delaying for a certain time period is a delay of 300 ms after the application of tuning data based on the first center frequency.

6. The method as claimed in claim 3,
wherein the second synchronization signal detection determination step comprises the steps of:
setting an AFT control flag to make an auto fine tuning available if the synchronization signal has not been detected during the first synchronization signal determination step,
calculating a second center frequency $f_0'$ by decreasing a first center frequency $f_0$ by a certain amount,
carrying out tuning by applying tuning data based on the second center frequency,
delaying a certain time period after the application of tuning data based on the second center frequency,
detecting the synchronization signal from the video signal tuned and applied after delaying for a certain period of time, and
determining that the synchronization signal has been detected.

7. The method as claimed in claim 6,
wherein the delay in the step for delaying for a certain time period is a delay of 300 ms after the application of tuning data based on the second center frequency.

8. The method as claimed in claim 6, wherein the second center frequency is a frequency decreased by 1.0 MHz from the first center frequency.

9. The method as claimed in claim 3, wherein the AFC level has 5 levels, the five levels range from '0' level to '4' level.

10. The method as claimed in claim 9,
wherein the tuning step is carried out by applying fine tuning data over a frequency band ranging from a point raised by 1.625 MHz to a point lowered by 0.625 MHz with reference to the first and the second center frequencies, respectively, according to an auto fine control (AFC) level.

11. The method as claimed in claim 10, wherein the tuning step comprises the steps of:
determining the AFC level for setting a counter value to '0' and determining the AFC level if the synchronization signal has been detected during the first and the second synchronization signal detection determination steps,
carrying out a first fine tuning while raising a fine tuning frequency by 62.5 KHz successively from a point lowered by 0.625 MHz with reference to the first and the second center frequencies according to the AFC level when the AFC level is less than and
carrying out a second fine tuning while lowering the fine tuning frequency by 62.5 KHz successively from a point raised by 1.625 MHz with reference to the first and the second center frequencies according to the AFC level when the AFC level is greater than '3'.

12. The method as claimed in claim 11, further comprising the steps of:
a repeated tuning step for carrying out the second synchronization signal detection determination step when fine tuning occurs in a frequency band ranging from a point raised by 1.625 MHz with reference to the second center frequency to a point lowered by 0.625 MHz with reference to the first center frequency when the first and the second fine tuning steps are made available by detecting the synchronization signal in the first synchronization signal detection determination step.

13. The method as claimed in claim 12, wherein the step for carrying out the first fine tuning while raising the fine tuning frequency by 62.5 KHz successively from a point lowered by 0.625 MHz with reference to the first and the second center frequencies according to the AFC level when the AFC level is less than '3'.

14. The method as claimed in claim 12, wherein the step for carrying out the second fine tuning while lowering the fine tuning frequency by 62.5 KHz successively from a point raised by 0.625 MHz with reference to the first and the second center frequencies according to the AFC level when the AFC level is greater than '3'.

15. The method as claimed in claim 13, wherein the first fine tuning step comprises the steps of:
proceeding to a repeated tuning step when the AFC level is less than '3', if the counter value is greater than '10',
increasing the counter value by '1' if the counter value is less than '10',
carrying out tuning by applying tuning data after raising the fine tuning frequency by 62.5 KHz from a point lowered by 0.625 MHz with reference to the first and the second center frequencies,
delaying a certain period of time,
proceeding to a step for determining the counter value if the AFC level is less than '3', and
saving a tuning mode with the fine tuning frequency lowered by 62.5 KHz from the tuning data having the raised frequency if the AFC level is greater than '3'.

16. The method as claimed in claim 15, wherein the step for delaying for a predetermined time period is a delay for 300 ms after the application of tuning data.

17. The method as claimed in claim 4,
wherein the step for carrying out a second fine tuning comprises the steps of:
proceeding to a repeated tuning step when the AFC level is greater than '3' and if the counter value is greater than '26',
increasing the counter value by '1' if the counter value is less than '26',
carrying out tuning by applying tuning data with the fine tuning frequency lowered by 62.5 KHz from a point raised by 1.625 MHz with reference to the first and the second center frequencies,
delaying for a certain period of time after application of the tuning data,
determining the counter value if the AFC level is greater than '2', and
saving the tuning mode with the tuning frequency raised by 62.5 KHz from the tuning data having the frequency lowered if the AFC level is less than '2'.

18. The method as claimed in claim 17, wherein the step for delaying for a predetermined time period is a delay for 300 ms after the application of tuning data.

19. The method as claimed in claim 12,
wherein the repeated tuning step comprises the steps of:
determining whether the AFT control flag is set, the AFT control flag making auto fine tuning available,
proceeding to the second synchronization signal detection determination step if the AFT control flag is not set, and
proceeding to the original center frequency tuning step for applying original center frequency as a tuning data if the AFT control flat is set.

* * * * *

(12) EX PARTE REEXAMINATION CERTIFICATE (5033rd)
United States Patent
Lee

(10) Number: US 5,650,830 C1
(45) Certificate Issued: Dec. 7, 2004

(54) DEVICE AND METHOD FOR AUTO FINE TUNING

(75) Inventor: Dong Ha Lee, Daegu-si (KR)

(73) Assignee: LG Electronics, Inc., Seoul (KR)

Reexamination Request:
No. 90/006,485, Dec. 16, 2002

Reexamination Certificate for:
Patent No.: 5,650,830
Issued: Jul. 22, 1997
Appl. No.: 08/337,187
Filed: Nov. 7, 1994

(30) Foreign Application Priority Data

Nov. 5, 1993 (KR) ......................................... 23414/1993

(51) Int. Cl.$^7$ .............................. H04N 5/50; H04N 5/44
(52) U.S. Cl. ..................... 348/731; 348/735; 455/183.1; 455/182.2; 455/192.2
(58) Field of Search ................................. 348/731, 732, 348/733, 735; 455/182.2, 182.3, 183.1, 192.2, 192.3, 192.1; H04N 5/50, 5/44

(56) References Cited

U.S. PATENT DOCUMENTS

| | | | | | |
|---|---|---|---|---|---|
| 4,763,195 A | * | 8/1988 | Tults | ............................ | 348/732 |
| 5,065,244 A | * | 11/1991 | Ishiguro et al. | ............. | 348/735 |
| 5,280,640 A | * | 1/1994 | Bae | ........................... | 455/182.3 |
| 5,299,011 A | * | 3/1994 | Choi | ........................... | 348/732 |
| 5,329,364 A | * | 7/1994 | Lee | ............................ | 725/151 |

FOREIGN PATENT DOCUMENTS

| | | | | |
|---|---|---|---|---|
| DE | 4002616 A1 | * 11/1990 | ............ | H04N/5/44 |
| JP | 56-105972 | * 8/1981 | ............ | H04N/5/44 |
| JP | 56-160031 | * 12/1981 | ............ | H04N/5/44 |
| JP | 1-177213 | * 7/1989 | ............ | H03J/7/02 |
| JP | 1-156631 | * 10/1989 | ............ | H04N/5/50 |
| JP | 3-64112 | * 3/1991 | ............ | H04N/5/50 |

OTHER PUBLICATIONS

Hans–Heinz Wohlrath, Kronach, "Das EPM–Abstimmsystem steuert Fernsehgerate", Funk–Technik, vol. 35, No. 3, 1980, pp. 104–108.*

Sasaki, et al., "One–Chip–Controlled Voltage Synthesizer TV tuning System", IEEE Transactions on Consumer Electronics, vol. CE–24, No. 1, Feb. 1978.*

The Service Manual for Funai models 6470, 7570, SC–680, SC–980, and FT2100 video cassette recorders (the FT2100 video cassette recorders).*

* cited by examiner

*Primary Examiner*—John Miller

(57) ABSTRACT

A device and method for auto fine tuning for a television or a VCR which carries out auto fine tuning using tuning data of a channel is provided. The AFC (Auto Fine Control) information detected in response to the AFT (Auto Fine Tuning) signal applied at the time of channel selection is used as the tuning data.

Exact and easy determination upon detection of a synchronization signal for the tuning data of the center frequency at the time of initial tuning is facilitated because the determination on the detection of synchronization signal is carried out in the process for processing video signals and reception of clear image through optimum tuning because the fine tuning is carried out utilizing AFT level.

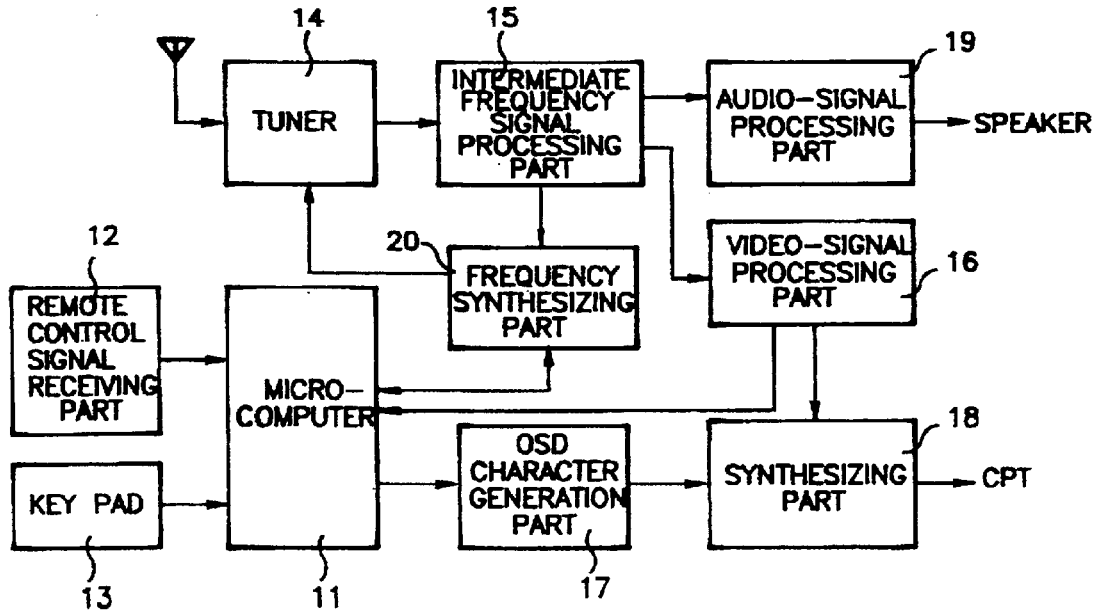

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 1–19 is confirmed.

New claims 20–69 are added and determined to be patentable.

20. *A device for auto fine tuning comprising:*
*a tuner for receiving broadcasting signals through an antenna according to band data;*
*an intermediate frequency signal processing part for processing a signal from said tuner into an intermediate frequency signal, for separating the intermediate frequency signal into a video signal and an audio signal, and for generating an auto fine control (AFC) voltage after detecting an auto fine tuning signal;*
*a frequency synthesizing part for scaling the auto fine control voltage received directly from the intermediate frequency signal processing part into auto fine control (AFC) digital data, generating band data according to tuning data, and applying the generated band data to the tuner;*
*a video signal processing part for detecting a synchronization signal from the video signal received from the intermediate frequency signal processing part; and*
*a microcomputer for applying the tuning data of a selected channel to the frequency synthesizing part to control the tuner according to the auto fine control digital data received directly from the frequency synthesizing part and the synchronization signal received directly from the video signal processing part.*

21. *The device for auto fine tuning of claim 20, wherein the frequency synthesizing part scaling the AFC voltage into AFC digital data comprises dividing the AFC voltage into a plurality of levels.*

22. *The device for auto fine tuning of claim 21, wherein said plurality of levels comprises up to five levels.*

23. *The device for auto fine tuning of claim 20, wherein said intermediate frequency signal processing part, said frequency synthesizing part, and said video signal processing part are adapted to communicate electrically within a printed circuit board.*

24. *The device for auto fine tuning of claim 20, wherein an integrated circuit comprises said intermediate frequency signal processing part, said frequency synthesizing part, and said video signal processing part.*

25. *The device for auto fine tuning of claim 20, wherein said scaling of said AFC voltage by said frequency synthesizing part comprises interpreting analog values of said AFC voltage and deriving from said analog values one or more words of data, wherein said words comprise a plurality of bits.*

26. *The device for auto fine tuning of claim 25, wherein said words comprise AFC digital data.*

27. *The device for auto fine tuning of claim 25, wherein said frequency synthesizing part further includes an analog-to-digital converter.*

28. *The device for auto fine tuning of claim 20, wherein said frequency synthesizing part for scaling auto fine control voltage received directly from the intermediate frequency signal processing part comprises a frequency synthesizing part, which receives analog voltage from a voltage source comprising said intermediate frequency signal processing part.*

29. *The device for auto fine tuning of claim 20, wherein said microcomputer is adapted to logically receive said auto fine control digital data from the frequency synthesizing part.*

30. *The device for auto fine tuning of claim 20, wherein said microcomputer is adapted to electrically receive said auto fine control digital data from the frequency synthesizing part.*

31. *The device for auto fine tuning of claim 20, wherein said microcomputer is adapted to electronically receive said auto fine control digital data from the frequency synthesizing part.*

32. *The device for auto fine tuning of claim 1, wherein the frequency synthesizer scales the AFC voltage into AFC digital data after dividing the possible values of the AFC voltage into a plurality of voltage ranges.*

33. *The device of auto fine tuning device of claim 32, wherein the frequency synthesizer scales the AFC voltage into AFC digital data by determining in which of the voltage ranges the AFC voltage lies, identifying one of a plurality of AFC levels corresponding to the determined voltage range and computing AFC digital data indicating the identified AFC level.*

34. *The device for auto fine tuning of claim 33, wherein said plurality of AFC levels are predetermined.*

35. *The device for auto fine tuning of claim 1, wherein said intermediate frequency signal processing part, said frequency synthesizer, and said video signal processing part are adapted to communicate electrically within a printed circuit board.*

36. *The device for auto fine tuning of claim 1, wherein an integrated circuit comprises said intermediate frequency signal processing part, said frequency synthesizer, and said video signal processing part.*

37. *The device for auto fine tuning of claim 1, wherein said scaling of said AFC voltage by said frequency synthesizer comprises interpreting analog values of said AFC voltage and deriving from said analog values one or more words of data, wherein each of said words comprises a plurality of bits.*

38. *The device for auto fine tuning of claim 37, wherein said words comprise AFC digital data.*

39. *The device for auto fine tuning of claim 37, wherein said frequency synthesizer further includes an analog-to-digital converter.*

40. *The device for auto fine tuning of claim 1, wherein said frequency synthesizer for scaling auto fine control voltage received directly from the intermediate frequency signal processing part comprises a frequency synthesizer which receives analog voltage from a voltage source comprising said intermediate frequency signal processing part.*

41. *The device for auto fine tuning of claim 1, wherein said microcomputer is adapted to logically receive said auto fine control digital data from said frequency synthesizer.*

42. *The device for auto fine tuning of claim 1, wherein said microcomputer is adapted to electrically receive said auto fine control digital data from said frequency synthesizer.*

43. The device for auto fine tuning of claim 1, wherein said microcomputer is adapted to electronically receive said auto fine control digital data from said frequency synthesizer.

44. The device of auto fine tuning of claim 1, wherein said band data is extracted from said tuning data.

45. The device of auto fine tuning of claim 1, wherein said band data is calculated from said tuning data.

46. The device of auto fine tuning of claim 1, wherein said band data is electrically generated from said tuning data.

47. The device of auto fine tuning of claim 1, wherein said band data is logically generated from said tuning data.

48. The device of auto fine tuning of claim 1, wherein said band data comprises a subset of said tuning data.

49. The device of auto fine tuning of claim 1, wherein said band data is analogous to said tuning data.

50. The device of auto fine tuning of claim 1, wherein said band data is identical to said tuning data.

51. The device of auto fine tuning of claim 1, wherein at least one of said tuner, said intermediate frequency processing part, said frequency synthesizer, said video signal processing part, and said microcomputer is part of a television.

52. The device of auto fine tuning of claim 1, wherein at least one of said tuner, said intermediate frequency processing part, said frequency synthesizer, said video signal processing part, and said microcomputer is part of a video cassette recorder (VCR) apparatus.

53. The device of auto fine tuning of claim 1, wherein at least one of said tuner, said intermediate frequency processing part, said frequency synthesizer, said video signal processing part, and said microcomputer is located partially in a television and partially in a video cassette recorder (VCR) apparatus.

54. The device of auto fine tuning of claim 1, wherein at least one of said tuner, said intermediate frequency processing part, said frequency synthesizer, said video signal processing part, and said microcomputer are integrated into a single integrated circuit.

55. The device of auto fine tuning of claim 1, wherein the functions of at least one of said tuner, said intermediate frequency processing part, said frequency synthesizer, said video signal processing part, and said microcomputer are performed by a single integrated circuit.

56. The device of auto fine tuning of claim 1, wherein at least one function of at least one of said tuner, said intermediate frequency processing part, said frequency synthesizer, said video signal processing part, and said microcomputer is performed by another member of the group of said tuner, said intermediate frequency processing part, said frequency synthesizer, said video signal processing part, and said microcomputer.

57. The device of auto fine tuning of claim 1, wherein at least one function of at least one of said tuner, said intermediate frequency processing part, said frequency synthesizer, said video signal processing part, and said microcomputer is performed by another member of the group of said tuner, said intermediate frequency processing part, said frequency synthesizer, said video signal processing part, and said microcomputer.

58. The device for auto fine tuning of claim 1, wherein
the frequency synthesizer generates band data according to tuning data; and
the microcomputer applies the tuning data to the frequency synthesizer according to the auto fine control data received from the frequency synthesizer without requiring the frequency synthesizer to apply the generated band data to the tuner.

59. A device for auto fine tuning comprising:

a tuner for receiving broadcasting signals through an antenna according to band data;

an intermediate frequency signal processing part for processing a signal from said tuner into an intermediate frequency signal, for separating the intermediate frequency signal into a video signal and an audio signal, and for generating an auto fine control (AFC) voltage after detecting an auto fine tuning signal;

a frequency synthesizing part for scaling the auto fine control voltage received from the intermediate frequency signal processing part into auto fine control (AFC) data, generating band data according to tuning data, and applying the generated band data to the tuner;

a video signal processing part for detecting a synchronization signal from the video signal received from the intermediate frequency signal processing part; and a microcomputer for applying the tuning data of a selected channel to the frequency synthesizing part to control the tuner according to the auto fine control data received from the frequency synthesizing part and the synchronization signal received from the video signal processing part, wherein the scaling of the AFC voltage into AFC digital data by the frequency synthesizing part comprises dividing the AFC voltage into a plurality of levels.

60. The device for auto fine tuning of claim 59, wherein said scaling of said AFC voltage by said frequency synthesizing part comprises interpreting values of said AFC voltage and deriving from said values one or more words of data, wherein said words comprise a plurality of bits.

61. The device for auto fine tuning of claim 60, wherein said words comprise AFC digital data.

62. The device for auto fine tuning of claim 61, wherein said values of said AFC voltage comprise analog voltage values.

63. The device for auto fine tuning of claim 62, wherein said frequency synthesizing part further includes an analog-to-digital converter.

64. The device for auto fine tuning of claim 59, wherein said intermediate frequency signal processing part, said frequency synthesizing part, and said video signal processing part are adapted to communicate electrically within a printed circuit board.

65. The device for auto fine tuning of claim 59, wherein an integrated circuit comprises said intermediate frequency signal processing part, said frequency synthesizing part, and said video signal processing part.

66. A device for auto fine tuning comprising:

a tuner for receiving broadcasting signals through an antenna according to band data;

an intermediate frequency signal processing part for processing a signal from said tuner into an intermediate frequency signal, separating the intermediate frequency signal into a video signal and an audio signal, and generating an auto fine control (AFC) voltage after detecting an auto fine tuning signal;

*a frequency synthesizing part for scaling the auto fine control voltage received from the intermediate frequency signal processing part into auto fine control (AFC) data indicating an AFC level of the AFC voltage, generating band data according to tuning data, and applying the generated band data to the tuner;*

*a video signal processing part for detecting a synchronization signal from the video signal received from the intermediate frequency signal processing part; and*

*a microcomputer for applying the tuning data of a selected channel to the frequency synthesizing part to control the tuner according to the auto fine control data received from the frequency synthesizing part and the synchronization signal received from the video signal processing part.*

67. *The device for auto fine tuning of claim 66, wherein the AFC level of the AFC voltage is one of a plurality of AFC levels that corresponds to the AFC voltage.*

68. *The device for auto fine tuning of claim 67, wherein the plurality of AFC levels are preassigned to a plurality of divided voltage ranges, respectively, in predetermined order.*

69. *The device for auto fine tuning of claim 68, wherein the microcomputer determines the tuning data based on a comparison between the AFC level indicated by the AFC data and a reference AFC level selected from the plurality of AFC levels.*

\* \* \* \* \*